(12) United States Patent
Koh et al.

(10) Patent No.: US 12,476,086 B2
(45) Date of Patent: Nov. 18, 2025

(54) SPRAY-COATED ELECTROSTATIC CHUCK DESIGN

(71) Applicant: Applied Materials, Inc., Santa Clara, CA (US)

(72) Inventors: Tuck Foong Koh, Singapore (RS); Sarath Babu, Singapore (RS); Yuichi Wada, Chiba (JP)

(73) Assignee: Applied Materials, Inc., Santa Clara, CA (US)

( * ) Notice: Subject to any disclaimer, the term of this patent is extended or adjusted under 35 U.S.C. 154(b) by 230 days.

(21) Appl. No.: 18/103,192

(22) Filed: Jan. 30, 2023

(65) Prior Publication Data

US 2024/0258076 A1 Aug. 1, 2024

(51) Int. Cl.
*H01J 37/32* (2006.01)
*H01L 21/683* (2006.01)

(52) U.S. Cl.
CPC .. *H01J 37/32477* (2013.01); *H01J 37/32715* (2013.01); *H01L 21/6833* (2013.01); *H01J 2237/0206* (2013.01); *H01J 2237/2007* (2013.01)

(58) Field of Classification Search
CPC .......... H01J 37/32477; H01J 37/32715; H01J 2237/0206; H01J 2237/2007; H01L 21/6833; H01L 21/6831; H01L 21/68742; H01L 21/6875; H01L 21/68757
USPC ....................................................... 361/234
See application file for complete search history.

(56) References Cited

U.S. PATENT DOCUMENTS

| 9,506,973 | B2* | 11/2016 | Simmons | H01L 21/6838 |
| 2003/0043530 | A1* | 3/2003 | Kwon | H01L 21/6833 361/234 |
| 2009/0284894 | A1 | 11/2009 | Cooke | |
| 2010/0109263 | A1* | 5/2010 | Jun | H01L 21/6831 29/527.4 |
| 2016/0099166 | A1* | 4/2016 | Yudovsky | H01L 21/68742 269/21 |
| 2018/0158711 | A1 | 6/2018 | Sasaki et al. | |
| 2022/0028720 | A1 | 1/2022 | Sulyman | |

FOREIGN PATENT DOCUMENTS

| KR | 100840971 B1 * | 6/2008 | H01L 21/67023 |
| KR | 20150066285 A * | 6/2015 | H01L 21/68742 |

OTHER PUBLICATIONS

International Search Report and Written Opinion Re: PCT Application No. PCT/US2024/010698.

\* cited by examiner

*Primary Examiner* — Sreeya Sreevatsa
(74) *Attorney, Agent, or Firm* — Patterson + Sheridan, LLP

(57) ABSTRACT

Embodiments of the disclosure include a substrate support including a metal body with a substrate face, a plurality of lift pin holes formed in the body, and a dielectric coating disposed on the substrate face of the body. Each of the plurality lift pin holes includes a through hole and a chamfer face configured to mate with a lift pin sleeve. The dielectric coating includes a substrate supporting surface, a thickness, and a pattern disposed in the substrate supporting surface.

15 Claims, 6 Drawing Sheets

SPRAY-COATED ELECTROSTATIC CHUCK DESIGN

BACKGROUND

Field

Embodiments of the present disclosure generally relate to semiconductor chamber components, and more particularly to a sleeve and substrate plate assembly for use in a substrate support.

Description of the Related Art

Reliably producing nanometer and smaller features is one of the key technology challenges for next generation very large scale integration (VLSI) and ultra-large-scale integration (ULSI) of semiconductor devices. However, as the limits of circuit technology are pushed, the shrinking dimensions of VLSI and ULSI interconnect technology have placed additional demands on processing capabilities. Reliable formation of gate structures on the substrate is important to VLSI and ULSI success and to the continued effort to increase circuit density and quality of individual substrates and die.

To drive down manufacturing cost, integrated chip (IC) manufacturers demand higher throughput, better device yield, and superior performance from every silicon substrate processed. Some fabrication techniques being explored for next generation manufacturing of semiconductor devices require processing without the fear of arching occurring between various components of a substrate support assembly. Coatings are often applied to components to help prevent arcing, but surfaces with small features often lead to an incomplete coating or porous areas. A critical area of a substrate support is the region near the lift pins. The lift pins are used to raise and lower the substrate on a substrate support assembly. The lift pins pass through small regions of the substrate support assembly. Previous designs have experienced poor and/or inconsistent coating characteristics at the regions of the substrate support assembly where the lift pins pass through.

Thus, there is a need for an improved substrate support assembly that solves the problems described above.

SUMMARY

Embodiments of the present disclosure generally relate to a body of a substrate support with lift pin sleeves in the body. More particularly, embodiments described herein provide apparatus and methods for a body of a substrate support assembly with a coating and lift pin holes.

In one embodiment, a substrate support is provided. The substrate support includes a metal body with a substrate face, a plurality of lift pin holes formed in the body, and a dielectric coating disposed on the substrate face of the body. Each of the plurality lift pin holes includes a through hole and a chamfer face configured to mate with a lift pin sleeve. The dielectric coating includes a substrate supporting surface, a thickness, and a pattern disposed in the substrate supporting surface.

In another embodiment, an electrostatic chuck assembly is provided. The electrostatic chuck assembly is configured to support a substrate when the substrate is disposed on an electrostatic chuck, wherein the electrostatic chuck assembly includes a body of the electrostatic chuck assembly, a substrate face configured to face a substrate, a dielectric coating disposed on the body, a plurality of lift pin holes disposed in the body, and a plurality of lift pin sleeves, disposed within the plurality of lift pin holes. The dielectric coating includes a top, a thickness, and a pattern disposed in the substrate face. Each of the plurality lift pin holes includes a top face coated by the dielectric coating, a chamfer face coated by the dielectric coating, and a depth. Each of the plurality of lift pin sleeves includes a sleeve material, a sleeve body, a substrate face, a pin hole disposed through the sleeve body, and a chamfer disposed on an exterior of the sleeve body.

In yet another embodiment, a method of manufacturing a body of an electrostatic chuck assembly is provided. The method includes forming a body with a substrate face; and a base face, flattening the substrate face and base face of the body, forming a plurality of lift pin holes through the body, chamfering the plurality of lift pin holes in the substrate face of the body, coating the body with a dielectric coating, cutting a pattern into the dielectric coating, and polishing the dielectric coating.

Embodiments of the disclosure include a method of manufacturing a body of an electrostatic chuck assembly comprising: forming a body comprising a substrate face, and a base face; forming a plurality of lift pin holes through the substrate face of the body to the base face of the body; chamfering the plurality of lift pin holes in the substrate face of the body; coating the body with a dielectric coating; forming a pattern in the dielectric coating disposed over the substrate face; and polishing the dielectric coating disposed over the substrate face.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to an electrostatic chuck assembly suitable for use in semiconductor fabrication processes. In one or more embodiments, the electrostatic chuck assembly is used at elevated processing temperatures of greater than 50° C., such as greater than 150° C. In one or more alternate embodiments, the electrostatic chuck assembly is used at cryogenic processing temperatures of less than 0° C., and less than −10° C., such as about −50° C. For example, the electrostatic chuck assembly is used at a cryogenic processing temperature of about −50° C. to about −150° C.

Figure 1:
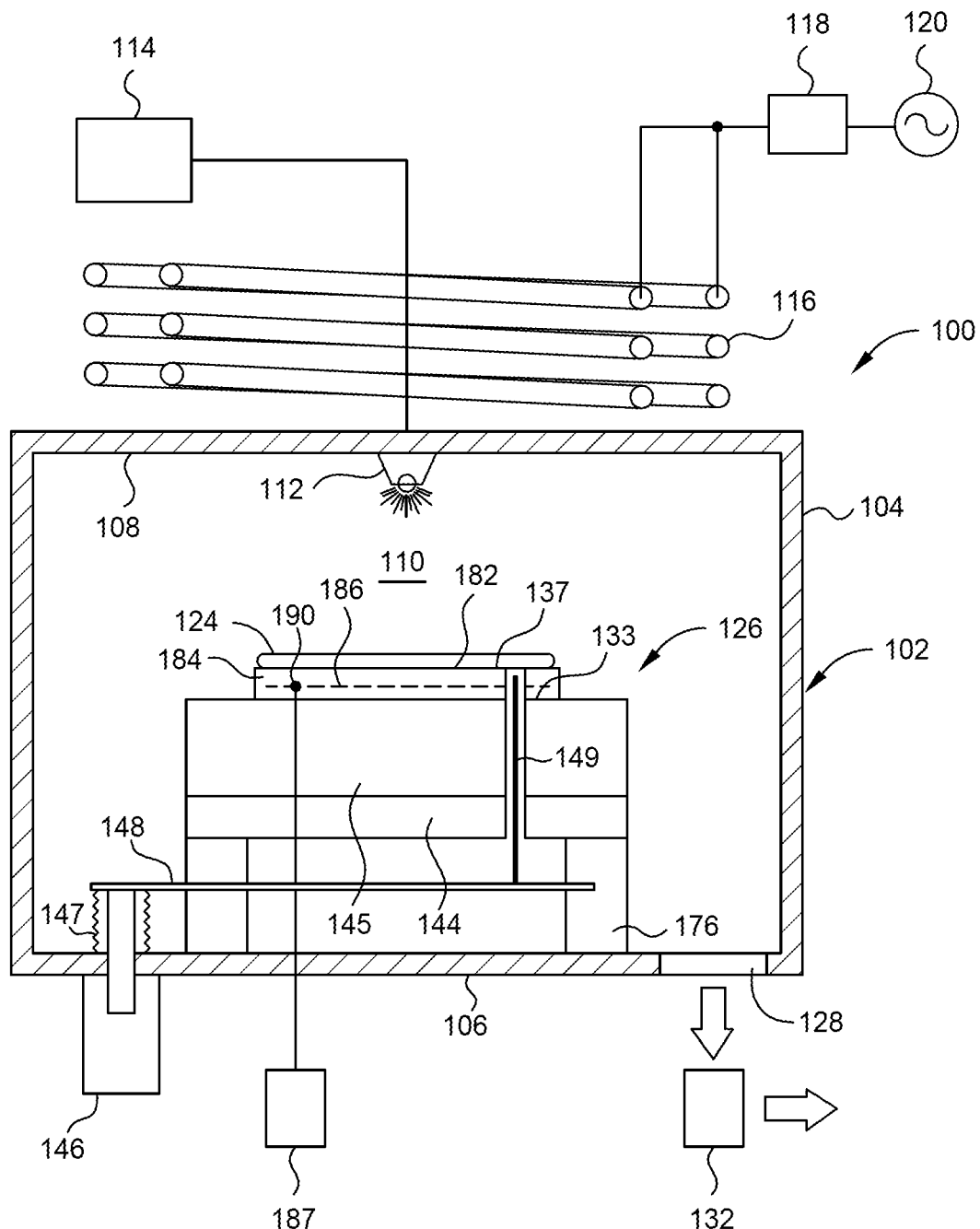
FIG. 1 is a cross-sectional schematic view of an exemplary plasma processing chamber according to an embodiment.

FIG. 1 is a cross-sectional schematic view of an exemplary plasma processing chamber 100, shown configured as an etch chamber, having a substrate support assembly 126. The substrate support assembly 126 may be utilized in other types of processing plasma chambers, for example plasma treatment chambers, annealing chambers, physical vapor deposition (PVD) chambers, chemical vapor deposition (CVD) chambers, ion implantation chambers, among others, as well as other systems where the ability to control processing uniformity for a surface or substrate is desirable.

The plasma processing chamber 100 includes a chamber body 102 having sidewalls 104, a bottom 106, and a lid 108 that encloses an interior processing region 110. An injection apparatus 112 is coupled to the sidewalls 104 and/or lid 108 of the chamber body 102. A gas panel 114 is coupled to the injection apparatus 112 to allow process gases to be provided into the processing region 110. The injection apparatus 112 may be one or more nozzles or inlet ports, or alternatively a showerhead. In other embodiments the injection assembly 112 may be replaced by a PVD target or gas delivery showerhead. Processing gas, along with any processing by-products, are removed from the processing region 110 through an exhaust port 128 formed in the sidewalls 104 or bottom 106 of the chamber body 102. The exhaust port 128 is coupled to a pumping system 132, which includes throttle valves and pumps utilized to control the vacuum levels within the processing region 110.

In some embodiments, the processing gas may be energized to form a plasma within the processing region 110. The processing gas may be energized by capacitively or inductively coupling RF power to the processing gases. In one example, which is depicted in FIG. 1, a plurality of coils 116 are disposed above the lid 108 of the plasma processing chamber 100 and coupled through a matching circuit 118 to an RF power source 120.

The substrate support assembly 126 is disposed in the processing region 110 below the injection apparatus 112. The substrate support assembly 126 includes an electrostatic chuck (ESC) assembly 184 and a facility plate 145. The facility plate 145 is supported by a base stand 176. The base stand 176 is supported by one of the sidewalls 104 and/or bottom 106 of the processing chamber. The substrate support assembly 126 may additionally include a heater assembly (not shown). Additionally, the substrate support assembly 126 may include a facility plate 145 and/or an insulator plate 144 disposed between an ESC assembly 184 and the base stand 176 to facilitate electrical, cooling, and gas connections with the substrate support assembly 126.

The facility plate 145 is formed from or otherwise contains one or more metal materials. The facility plate 145 can include a plurality of cooling channels formed therein. The cooling channels may be connected to a heat transfer fluid source (not shown). The heat transfer fluid source provides a heat transfer fluid, such as a liquid, gas or combination thereof, which is circulated through one or more cooling channels disposed in the facility plate 145. The fluid flowing through neighboring cooling channels may be isolated to enable local control of the heat transfer between the ESC assembly 184 and different regions of the facility plate 145, which assists in controlling the lateral temperature profile of a substrate 124.

The ESC assembly 184 includes one or more chucking electrodes 186 disposed in the ESC assembly 184. The chucking electrode 186 is connected to a power source 187. In some embodiments the ESC assembly 184 is a monopolar ESC and the chucking electrode 186 uses the power source 187 to bias the ESC assembly 184 for securing a substrate during a deposition process. The power source 187 connects to the ESC assembly 184 to create an electrical bias using the electrode 186. The power source 187 may be connected at connection 190 by a threaded connection, or other suitable connection methods. The ESC assembly 184 is disposed between the processing region 110 and the facility plate 145. The ESC assembly 184 has substrate support surface 137 and facility plate face 133 opposite the substrate support surface 137. The substrate support surface 137 of the ESC assembly 184 contacts the substrate 124 on the ESC face 182 of the substrate 124. In some embodiments, the substrate support surface 137 is a top surface of a coating.

The plasma processing chamber 100 also includes a lift pin assembly. The lift pin assembly includes an actuator 146 that may be coupled to at least some of the chamber walls 104, 106, 108. The lift pin assembly also includes a bellows 147. The bellows 147 seals the actuator 146 from the process region 110. The lift pin assembly also includes a lift pin plate 148 that is configured to raise a plurality of lift pins 149. The lift pins are coupled to the lift pin plate 148. The lift pin plate 148 is coupled to the actuator 146. Lift pin holes 300 (shown in FIG. 3) allow the lift pins 149 to pass through the ESC assembly 184, to accommodate the lift pins 149 elevating the substrate 124 above the substrate support surface 137. The substrate 124 is lifted above the substrate support surface 137 to facilitate a robotic transfer unit into and out of the plasma processing chamber 100.

A bonding layer is disposed between the facility plate 145 and the ESC assembly 184. The bonding layer secures the ESC assembly 184 to the facility plate 145. In other embodiments, the bonding layer is disposed between the ESC assembly 184 and a lower plate (not shown) that is disposed between the ESC assembly 184 and facility plate 145. In some embodiments, the ESC assembly 184 and the facility plate 145 are coupled by mechanical means, but may also be coupled by adhesives, or any combination of means.

Figure 2:
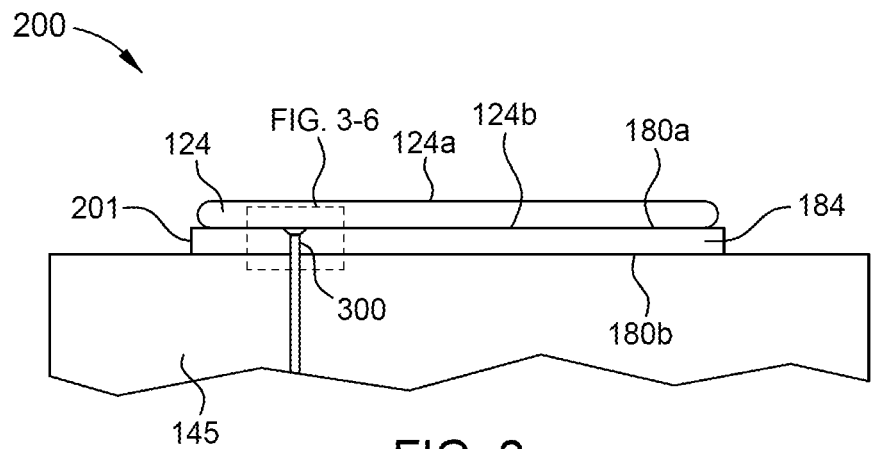
FIG. 2 is a schematic sectional view of an exemplary substrate support assembly according to an embodiment.
Figure 3:
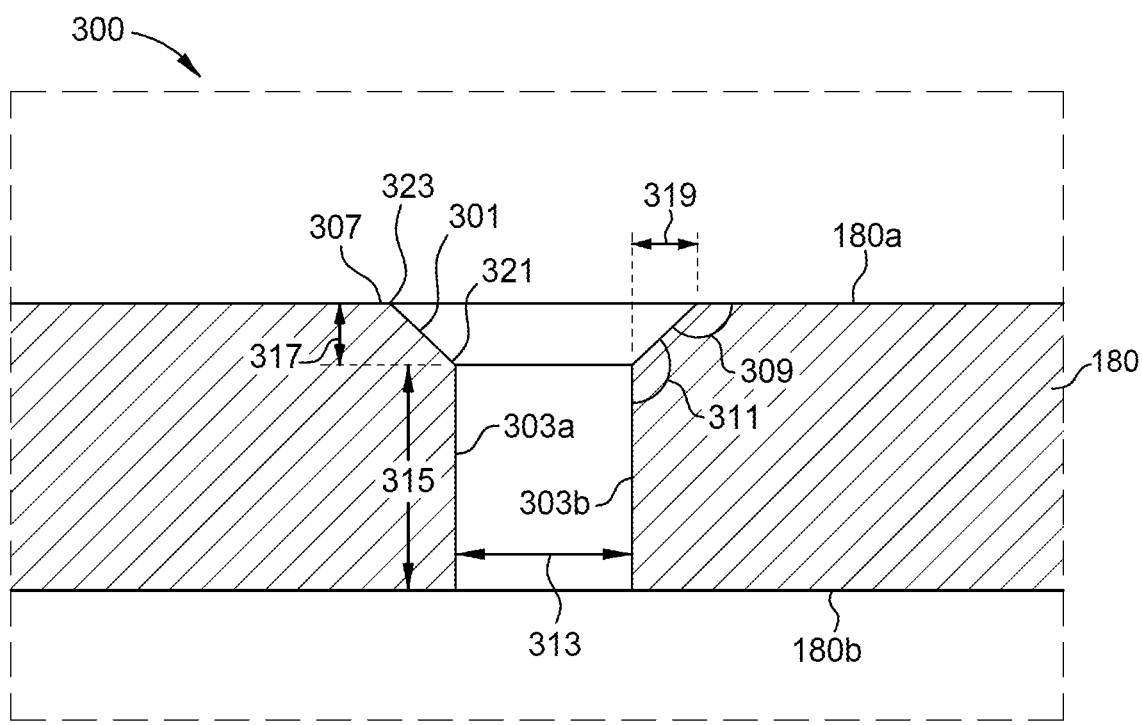
FIG. 3 is a cross-sectional schematic view of a portion of the substrate support assembly of FIG. 2.

FIG. 2 depicts a cross-sectional schematic side view of an ESC upper area 200, according to one or more embodiments described and discussed herein. The ESC upper area 200 illustrates the ESC assembly 184 disposed between the substrate 124 and the facility plate 145. According to some embodiments the ESC assembly 184 and the facility plate 145 are a single body. The substrate 124 includes a process surface 124a facing the process volume and a support surface 124b in contact with the substrate face 180a of the ESC assembly 184. The ESC assembly 184 includes a radially exterior face 201 along the diameter of the ESC assembly 184. The ESC assembly 184 diameter may be between about 100 mm to about 600 mm, for example between 200 mm and about 500 mm. The exterior face 201 has a width that is equal to the thickness of the ESC assembly 184. The width of the ESC assembly 184 may be defined by the distance between the substrate face 180a and base face 180b, of the ESC assembly 184. The width of the exterior face 201 may be between about 5 mm and about 35 mm, for example between about 5 mm and about 25 mm. The ESC assembly 184 is made of a material that may include stainless steel, aluminum, or titanium or any combination thereof, but other materials are contemplated. In some embodiments, the ESC assembly 184 has an edge feature, for example, a shoulder, that allows an edge ring of to be positioned thereon or minimize a gap around the ESC assembly 184. FIG. 3 further illustrates a lift pin hole 300 in the ESC assembly 184.

FIG. 3 illustrates a more detailed view of the lift pin hole 300 through the ESC assembly 184. The ESC assembly 184 includes a chuck plate body 180, according to some embodiments. The lift pin hole 300 includes a lift pin region 307. The lift pin region 307 is the area on the substrate face 180a of the body 180 of the ESC assembly 184 that includes a chamfer face 301 of the lift pin hole 300. The chamfered face 301 ends at the start of the hole body region 321 within the body 180. The chamfered face 301 has a chamfer lateral thickness 319 and a chamfer depth 317. The thickness and depth 317, 319 may be between about 1 mm to about 20 mm and may be equal or vary. For example, the thickness and depth 317, 319 may be between about 1 mm to about 15 mm. The chamfer face 301 creates an angle 309 with the body substrate face 180a. The chamfer face 301 creates an angle 311 with the pin hole walls 303. The angles 309, 311 may each be between about 90° and about 180°. The angles 309, 311 may be equal or vary. For example, the angles 309, 311 may both be 135°. As illustrated the pin holes walls 303 have a left side 303a and right side 303b. The hole body region 321 of the lift pin holes 300 has a diameter 313. The diameter 313 may be between about 1 mm to about 40 mm, for example between about 5 mm to about 30 mm. The lift pin holes 300 also include an outer diameter 323 of the chamfer face 301 that is defined by the diameter 313 combined with double the lateral width 319 of the chamfer face 301. The hole body region 321 has a depth 315. For example, the body depth 315 may be between about 10 mm and about 120 mm. For example, the body depth 315 may be between about 20 mm and about 120 mm. The chamfer depth 317 and the body depth 315 equal the width between the body substrate face 180a and the body base face 180b. In addition to a chamfer, other embodiments of the lift pin hole 300 include a lift pin hole 300 with a filet, with a recessed shoulder, a lift pin hole 300 that is a square hole, and/or a lift pin hole 300 without a feature.

Figure 4:
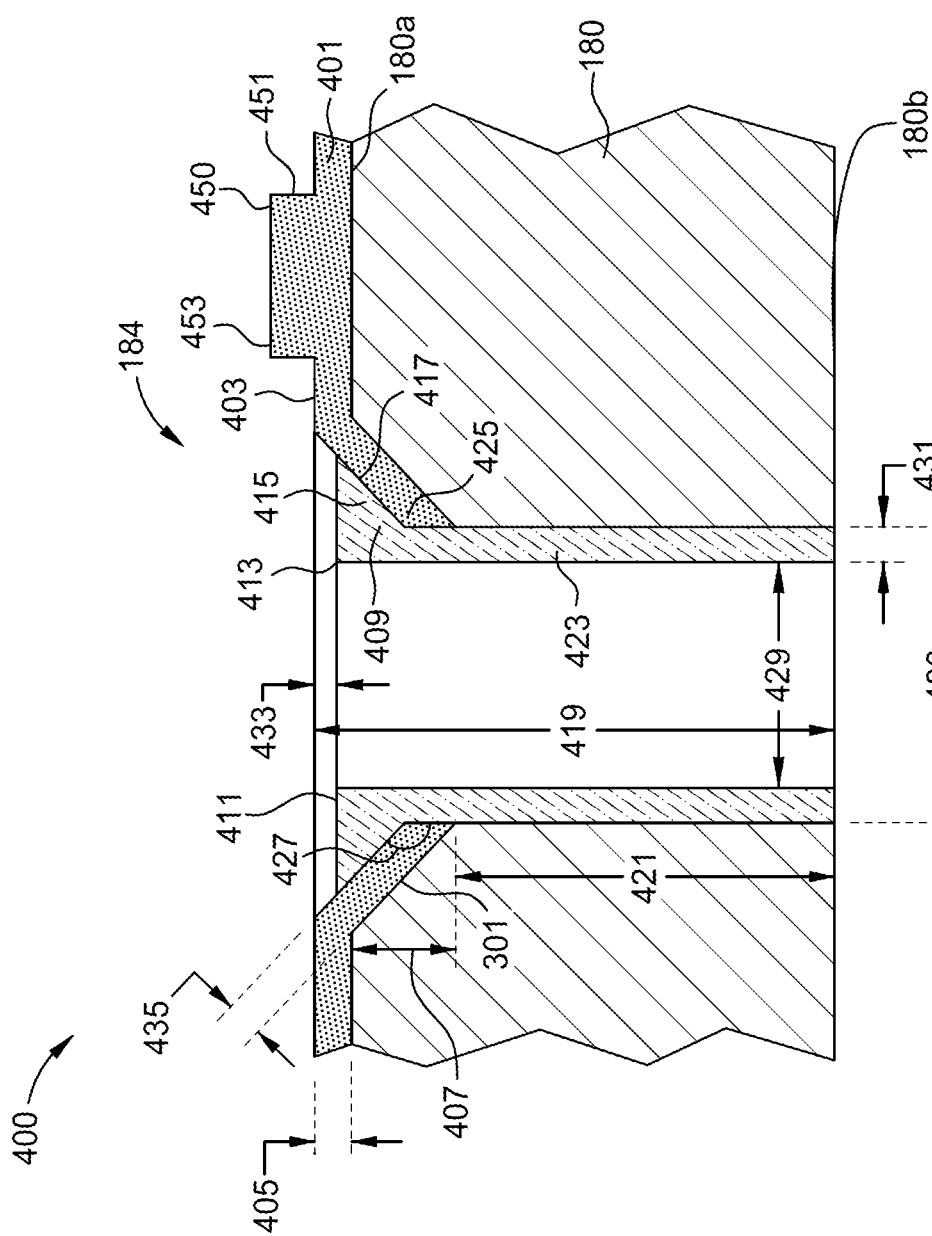
FIG. 4 is a cross-sectional schematic view of a sleeve as disclosed herein.

FIG. 4 illustrates an embodiment of the ESC assembly 184 with the body 180, a sleeve assembly 400 installed in the body 180, and a coating 401 disposed thereon. In some embodiments the body 180 has a coating 401 that includes a dielectric material disposed on the substrate face 180a of the body 180 and a lift pin sleeve 409 inserted in the lift pin hole 300. In some embodiments, the coating 401 includes a dielectric material, such as aluminum oxide, magnesium oxide, zirconium oxide, chromium oxide, Titania, Yttria stabilized Zirconia and magnesium aluminate. The coating 401 has a top surface 403, a thickness 405 between the top surface 403 and the substrate face 180a of the body 180. For example, the thickness 405 is between about 0 mm and about 0.7 mm, for example between about 0.01 mm and about 0.5 mm. The coating 401 also includes a pattern that is formed in the top surface 403 by a machining process. The pattern may be a mesa pattern, having individual square mesas' 450 that are higher than the rest of the top surface 403. In some embodiments, the top of the mesa 450 is the substrate support surface 137. Each mesa 450 has a height 451 above the top surface 403 and a width 453. For example, the height 451 may be between about 0 mm and about 0.7 mm, for example between about 0.01 mm and about 0.5 mm. For example, the width 453 may be between about 0 mm and about 0.7 mm, for example between about 0.01 mm and about 0.5 mm. The pattern may also be any other suitable design. The coating 401 extends along the chamfered face 301 a depth 407 and has a thickness 435 along the chamfer face 301. For example, the thickness 435 is between about 2 mm and about 5 mm. For example, the depth 407 is between about 0 mm and about 15 mm. When the coating 401 is applied using a sprayer, overspray can occur and contact certain areas of the lift pin hole 300. To mitigate overspray, the lift pin holes can have filler parts inserted during the coating process. For example if, the design does not want the coating 401 within an uncoated length 421 then a temporary part can be inserted to ensure the coating is contained to only the chamfer face 301. The coating 401 on the chamfer face 301 can prevent contact between the substrate 127 and the body 180. The lift pin hole 300 can include an uncoated length 421 which is defined as the distance from the depth 407 to the base face 180b. The uncoated length 421 may be between about 1 mm and about 100 mm. The chamfer coating 425 creates an angle 427 and a mating face 417 that contacts the lift pin sleeve 409. For example, the angle 427 may be about equal to the chamfer face angle 311. In some embodiments the angle 427 may be between about 90° and about 180°.

The body 180 may be formed from a sheet or plate of material, which by use of a machining process, allows the features and dimension of the body 180 to be desirably formed. Once formed, the body 180 will have the lift pins holes 300 with the chamfer face 301. The body 180 is then coated with the dielectric coating 401. The coating 401 may be sprayed on, and/or applied by manual means, for example a painted on coating. Other application means are also contemplated, for example an electroplating process. Once coated the coating 401 will then be polished and have the pattern cut into the coating 401. After the pattern is cut the lift pins sleeves 409 will be secured into the lift pin holes 300.

The lift pin sleeve 409 according to some embodiments includes a sleeve body 423 and a chamfer region 415. The sleeve body 423 includes an inner diameter 429, an outer body diameter 430, and a body thickness 431. The inner diameter 429 can be between about 4 mm and about 12 mm in diameter. The outer body diameter 430 can between about 8 mm and about 22 mm, and is generally sized to fit within the diameter 313 formed in the body 180. The body thickness 431 of the lift pin sleeve 409 can between about 4 mm and about 18 mm. The chamfer region 415 includes, a top face 411, a corner 413, and a seating distance 433 defined by a distance measured from the coating top surface 403 to the sleeve top face 411. The seating distance 433 may be between 0 mm and about 5 mm. In some embodiments the total depth 419 is defined from the coating top surface 403 to the base face 180b of the chuck plate. The total depth 419 can be between about 5 mm and about 25 mm. In some embodiments, when the ESC assembly 184 and facility plate 145 are a single body, the depth 419 is the depth of the facility plate plus between about 5 mm and about 25 mm. In some embodiments, the sleeve is secured in the ESC assembly 184 by at least a press fit, inference fit, by an adhesive, and/or any combination thereof. Other methods of securing the sleeve 409 are contemplated.

Figure 5:
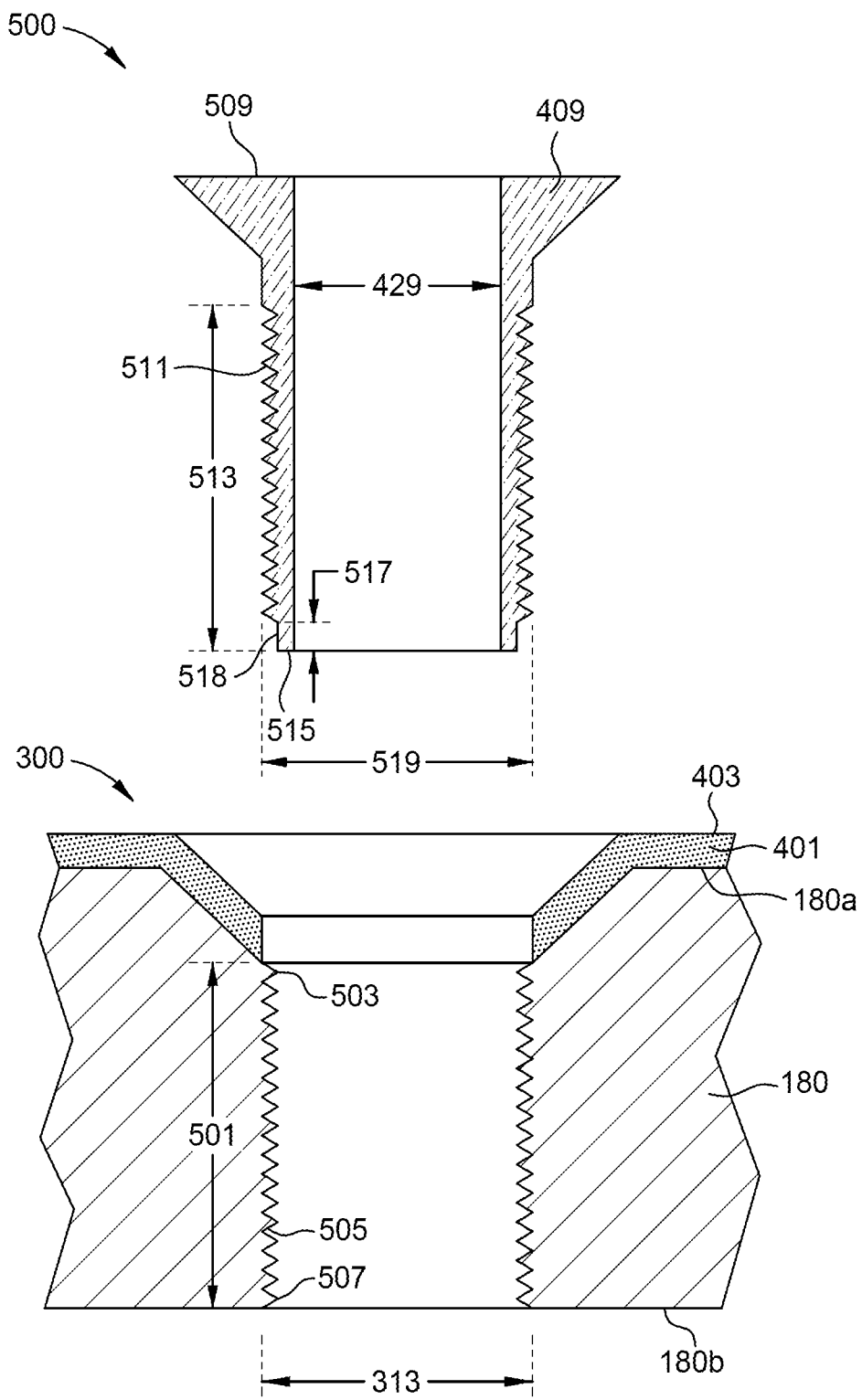
FIG. 5 is a cross-sectional schematic view of a sleeve as disclosed herein.
Figure 5A:
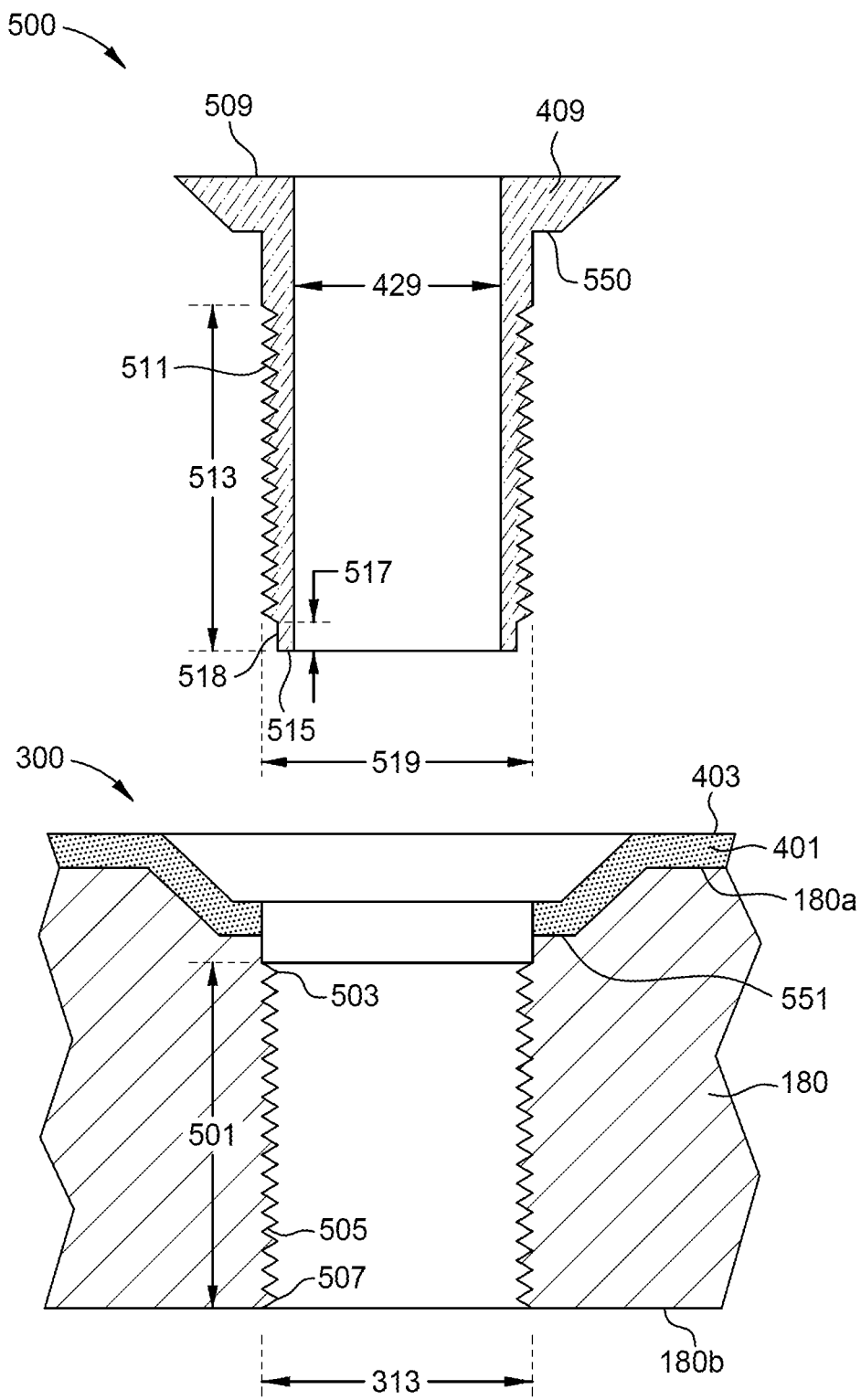
FIG. 5A is a cross-sectional schematic view of a sleeve as disclosed herein.
Figure 6:
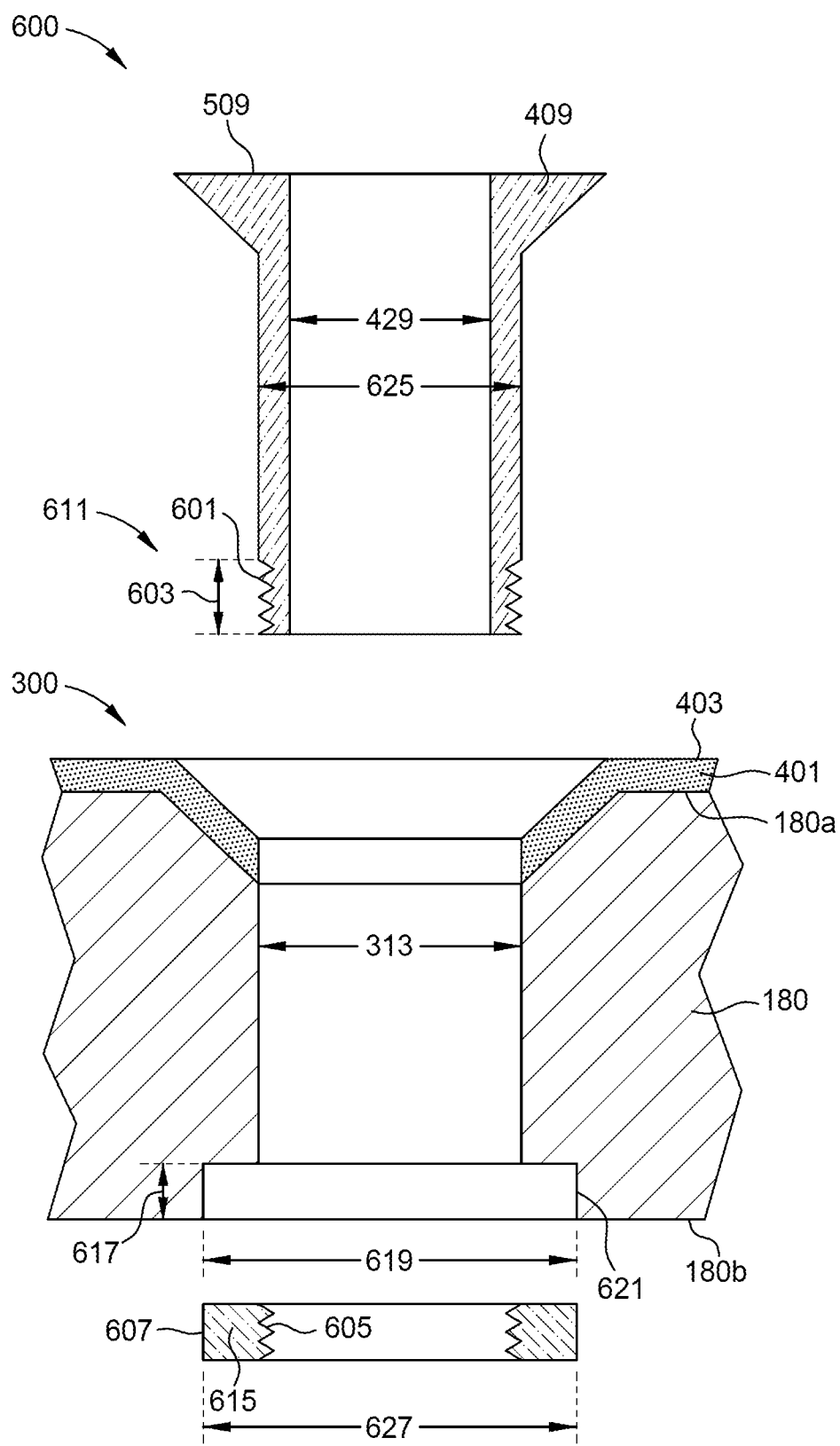
FIG. 6 is a cross-sectional schematic view of a sleeve as disclosed herein.

FIGS. 5, 5A, and 6 are illustrate three embodiments of the lift pin sleeve 409 that include methods of securing the sleeve 409 into the ESC assembly 184.

FIG. 5 illustrates a threaded embodiment 500 of the lift pin sleeve 409 and the body 180 that includes threads 505, 511. The lift pin sleeve 409 has a top 509, internal diameter 429, an outer diameter 519, and threaded region with a length 513. The sleeve threads 511 are standard thread sizes with the pitch, thread angle, inner, and outer diameter being dependent on design conditions. As shown the threads 511 are pointed threads, but other threads are contemplated, for example square threads or tapered threads. In some embodiments, the threads are fine threads (e.g., unified national fine (UNF) threads) so that the fluid volume trapped between the mating sets of threads is minimized to allow for an efficient evacuation of the threaded region during processing. The threaded region 513 may extend to the sleeve bottom 515, but may also include a tip feature 518. The threaded region 513 can be between about 25 mm and about 35 mm in length, but will typically at a minimum include at least three engaged threads. As shown the tip feature 518 is an indexing portion not having threads. The alignment or indexing feature 518 is does not have threads for a length 517. The length 517 may between 0 and about 25 mm for example between about 5 mm to about 15 mm. The sleeve threads 511 screw into the plate threads 505. The plate threads 505 have a start point 503 at the end of the chamfer face 301 and an end point 507. The lift pin hole 300 has a diameter 313 that is concentric with the sleeve outer diameter 519. The threads start point 503 can be further recessed in the lift pin hole 300, for example the start point 503 can be recessed about 10 mm. As shown the threads end at the end point 507, the chuck plate base face 180b. The end point 507 can also be within the lift pin hole 300, offset from the base face 180b, for example the end point 507 can be offset from the base face 180b between about 0 mm to about 10 mm. The plate threads 505 have a length 501, defined by the start and end points 503, 507. The length 501 may be about 5 mm to about 15 mm. The lift pin sleeve 409 will be screwed into the body 180 to a certain depth. The depth can be when the sleeve top 509 is co-planar with coating top 403. Additionally, the lift pin sleeve 409 can be screwed in such that the surface of the sleeve top 509 is above or below the top 403 of the coating 401. For example the sleeve 409 can be screwed in to align the sleeve top 509 with the body substrate face 180a.

FIG. 5A illustrates a similar embodiment to FIG. 5 with the addition of a sleeve shoulder 550. The sleeve shoulder 550 has a width between about 0 mm to 10 mm, for example 5 mm to about 7 mm. The sleeve shoulder 550 corresponds to the hole shoulder 551. The hole shoulder 551 has a width between about 0 mm to about 10 mm, for example 5 mm to about 7 mm. The coating 401 continues on from the chamfer coating 425 on top of the hole shoulder 551 according to some embodiments.

FIG. 6 shows a nut embodiment 600 of the lift pin sleeve 409 and body 180 with a securing method where the lift pin sleeve 409 is secured to the body 180 by a nut 615. In some embodiments the lift pin sleeve 409 has a sleeve top 509, an inner diameter 429, an outer diameter 625, and a lower threaded portion 611. The outer diameter 625 can be about 5 mm to about 10 mm. The lower threaded portion 611 includes threads 601 that extend a thread length 603. The thread length 603 can be about 0 mm to about 15 mm. The sleeve threads 603 mate with the nut threads 605. The nut 615 can be circular, a hex nut or other suitable nut shapes. The nut 615 may be made of a Teflon™ containing material, a PEEK™ containing material, and/or a Rexolite™ containing material, and/or any other suitable materials. For example the nut may be made of a material containing a non-conductive ceramic. The nut 615 has a thickness 607 and a diameter 627 or farthest exterior point that is sized to fit within a nut recess 621 of the body 180. For example, the nut diameter 627 may be about 20 mm to about 31 mm and the nut thickness 607 may be about 5 mm to about 20 mm.

The nut recess 621 has a diameter 619 and a depth 617. The nut recess diameter 619 may be about 25 mm to about 45 mm. The nut recess depth 617 may be about 5 mm to about 20 mm. In some embodiments the nut recess 621 is configured to enable a ⅝ nut under ASME B1.1, UNC to be secured to the lift pin sleeve 409 with the nut 615 body being between the body substrate face 180a and the base face 180b. The diameter 619 is concentric with the inner diameter 313. In other embodiments the nut recess 621 is not concentric with the inner diameter 313 of the lift pin hole. Further, in other embodiments the recess 621 is a square or squamous shape and may be designed to hold the nut 615 in place while the sleeve 409 is screwed in. Additionally, the nut 615 can tighten the lift pin sleeve 409 such that the surface of the sleeve top 509 is above or below the top 403 of the coating 401. For example the nut 615 can be tightened to align the sleeve top 509 with the body substrate face 180a.

While the foregoing is directed to examples of the present disclosure, other and further examples of the disclosure may be devised without departing from the basic scope thereof, and the scope thereof is determined by the claims that follow.

What is claimed is:

1. A substrate support, comprising:
   a body having a substrate face, wherein the body comprises a metal;
   a plurality of lift pin holes formed in the body, wherein each of the plurality lift pin holes comprises:
      a through hole; and
      a chamfer face extending between the substrate face and the through hole, wherein the chamfer face is configured to mate with a lift pin sleeve of a plurality of lift pin sleeves, wherein each lift pin sleeve of the plurality of lift pin sleeves includes a sleeve body with exterior threads disposed on an exterior of the sleeve body;
   a dielectric coating disposed on the substrate face and the chamfer face, wherein the dielectric coating comprises:
      a substrate supporting surface;
      a thickness; and
      a pattern disposed in the substrate supporting surface; and
   a plurality of sleeve nuts, the exterior threads of each lift pin sleeve configured to be threaded into a respective sleeve nut of the plurality of sleeve nuts, wherein each sleeve nut of the plurality of sleeve nuts is configured to secure a surface of each lift pin sleeve of the plurality of lift pin sleeves to a portion of the dielectric coating disposed over the chamfer face.

2. The substrate support of claim 1, wherein each lift pin sleeve of the plurality of lift pin sleeves further comprises:
   a sleeve material;
   a substrate face;
   a pin hole disposed through the sleeve body; and
   a chamfer disposed on an exterior of the sleeve body.

3. An electrostatic chuck assembly, configured to support a substrate when the substrate is disposed on an electrostatic chuck, wherein the electrostatic chuck assembly comprises:
   a body of the electrostatic chuck assembly;
   a substrate face configured to face the substrate;
   a dielectric coating disposed on the body, wherein the dielectric coating comprises:
      a top;
      a thickness; and
      a pattern disposed in the substrate face;
   a plurality of lift pin holes disposed in the body, wherein each of the plurality of lift pin holes comprises:

a top face coated by the dielectric coating;
a chamfer face coated by the dielectric coating; and
a depth;
a plurality of lift pin sleeves, disposed within the plurality of lift pin holes, wherein the each of the plurality of lift pin sleeves comprises:
a sleeve body comprising a sleeve material;
a substrate face;
a pin hole disposed through the sleeve body;
an exterior threaded region disposed on an exterior of the sleeve body; and
a chamfer disposed on an exterior of the sleeve body; and
a plurality of sleeve nuts, each exterior threaded region of the plurality of lift pin sleeves configured to be threaded into a corresponding sleeve nut of the plurality of sleeve nuts, each sleeve nut of the plurality of sleeve nuts configured to secure the chamfer to the dielectric coating of the chamfer face.

4. The electrostatic chuck assembly of claim 3, wherein the exterior threaded region extends from a base of the chamfer to about a bottom face of the sleeve body.

5. The electrostatic chuck assembly of claim 3, wherein the exterior threaded region is disposed in a lower region of the sleeve body to about a bottom face of each of the plurality of lift pin sleeves.

6. The electrostatic chuck assembly of claim 3, wherein the plurality of sleeve nuts are comprised of the sleeve material.

7. The electrostatic chuck assembly of claim 3, wherein the sleeve material comprises a Teflon containing material.

8. The electrostatic chuck assembly of claim 3, wherein the substrate face of the plurality of lift pin sleeves is aligned with the top face of the dielectric coating.

9. The electrostatic chuck assembly of claim 3, wherein the substrate face of the plurality of lift pin sleeves is disposed a distance from the top face of the dielectric coating.

10. The electrostatic chuck assembly of claim 3, wherein the pin hole of the plurality of lift pin sleeves comprises a diameter configured to have a pin tolerance.

11. The electrostatic chuck assembly of claim 3, wherein the electrostatic chuck is configured to be a monopolar chuck.

12. A method of manufacturing a body of an electrostatic chuck assembly comprising:
forming the body comprising:
a substrate face; and
a base face;
forming a plurality of lift pin holes through the substrate face of the body to the base face of the body;
chamfering the plurality of lift pin holes in the substrate face of the body to form a chamfer face of each lift pin hole of the plurality of lift pin holes;
coating the body with a dielectric coating;
forming a pattern in the dielectric coating disposed over the substrate face;
forming a plurality of nut recesses in the base face of the body;
polishing the dielectric coating disposed over the substrate face;
disposing a lift pin sleeve in a lift pin hole of the plurality of lift pin holes, the lift pin sleeve comprising:
a threaded region disposed on an exterior of a sleeve body; and
a chamfer region disposed over the dielectric coating disposed on the chamfer face; and
securing the chamfer region to the chamfer face of the dielectric coating by securing a sleeve nut to the threaded region of the lift pin sleeve, the sleeve nut disposed in a nut recess of the plurality of nut recesses.

13. The method of claim 12, wherein coating the body comprises coating the substrate face and chamfered portion of the plurality of lift pin holes, while substantially preventing coating from being disposed on a surface of the lift pin holes and the base face.

14. The method of claim 12, wherein the plurality of lift pin holes are configured to mate with the lift pin sleeve.

15. The method of claim 14, further comprising:
threading the plurality of lift pin holes.

* * * * *